US008228150B2

(12) United States Patent
Golz et al.

(10) Patent No.: US 8,228,150 B2

(45) Date of Patent: Jul. 24, 2012

(54) ELECTROMAGNETIC ACTUATING APPARATUS

(75) Inventors: Thomas Golz, Sipplingen (DE); Achim Riedle, Steisslingen (DE); Uwe Wagner, Volketswil (CH)

(73) Assignee: ETO Magnetic GmbH, Stockach (DE)

( * ) Notice: Subject to any disclaimer, the term of this patent is extended or adjusted under 35 U.S.C. 154(b) by 490 days.

(21) Appl. No.: 12/375,969

(22) PCT Filed: Aug. 2, 2007

(86) PCT No.: PCT/EP2007/006826

§ 371 (c)(1), (2), (4) Date: Mar. 23, 2009

(87) PCT Pub. No.: WO2008/014994

PCT Pub. Date: Feb. 7, 2008

(65) Prior Publication Data

US 2009/0189724 A1 Jul. 30, 2009

(30) Foreign Application Priority Data

Aug. 3, 2006 (DE) ..................... 20 2006 011 904 U

(51) Int. Cl.
*H01F 7/08* (2006.01)
*H01L 27/02* (2006.01)
*H01H 51/22* (2006.01)

(52) U.S. Cl. ....................................... 335/282; 335/220

(58) Field of Classification Search .......... 335/220–229, 335/278, 282; 336/117–122
See application file for complete search history.

(56) References Cited

U.S. PATENT DOCUMENTS

| | | | | |
|---|---|---|---|---|
| 2,759,062 | A * | 8/1956 | O'Neill | 335/179 |
| 4,095,206 | A | 6/1978 | Hishiki | |
| 5,323,133 | A * | 6/1994 | Heath et al. | 335/222 |
| 5,407,131 | A * | 4/1995 | Maley et al. | 239/90 |
| 5,710,535 | A * | 1/1998 | Goloff | 336/192 |
| 6,093,036 | A | 7/2000 | Tohgo et al. | |
| 6,121,865 | A | 9/2000 | Dust et al. | |
| 6,144,278 | A | 11/2000 | Nishida et al. | |
| 7,768,368 | B2 * | 8/2010 | Muffler et al. | 335/278 |
| 2004/0113731 | A1 * | 6/2004 | Moyer et al. | 335/220 |
| 2004/0201441 | A1 | 10/2004 | Elendt et al. | |

FOREIGN PATENT DOCUMENTS

| | | |
|---|---|---|
| CN | 2150662 | 12/1993 |
| CN | 1219007 | 6/1999 |
| DE | 10240774 | 4/2003 |

* cited by examiner

*Primary Examiner* — Bernard Rojas
(74) *Attorney, Agent, or Firm* — Bachman & LaPointe, P.C.

(57) ABSTRACT

An electromagnetic actuating apparatus having an elongated actuating element (3) which forms an engagement area (11) at the end, can be moved by the force of a coil device (13), (which is provided in a stationary manner) and has a permanent magnet (4), in places, which are designed to interact with a stationary core area (7), with a stationary bearing element (8) which acts as a yoke, being provided axially opposite the core area (7) for the actuating element (3), which is in the form of a piston at least in places, and with the coil device (13) having at least one coil winding (17) which is arranged on a mount (15) and whose winding wires (22, 23) are passed to contact elements (20, 21) and are electrically conductively connected to them, with the connections (24, 25) between the winding wires (22, 23) and the contact elements (20, 21) being arranged with vibration or oscillation damping with respect to the mount (15).

10 Claims, 2 Drawing Sheets

ELECTROMAGNETIC ACTUATING APPARATUS

BACKGROUND OF THE INVENTION

The present invention relates to an electromagnetic actuating apparatus.

Apparatuses such as these have been known for a long time and are used for many purposes. The fundamental principle is that an actuating element which is in the form of a piston and has an inlet area at the end for the intended actuating task is guided in a generally magnetically permeable housing as an armature between a stationary core area and a mounting element, which acts as a yoke, and can be operated by means of an electromagnet which is provided approximately in the core area.

DE 102 40 774 A1, from the same applicant, discloses an electromagnetic actuating apparatus of this generic type, with major elements. In the case of the known actuating apparatus, the coil device surrounds a plastic support on which a coil winding is wound. The winding wires of the coil winding are normally passed to contact elements and are electrically conductively connected to them, with the contact elements being used for connection to an external power supply. The contact elements are generally part of an electrical plug connection. When the actuating element is moved back in the direction of the coil device, for example by current being passed through the coil winding, the actuating element and/or the permanent magnet arrangement is moved, generally without braking, with respect to the plastic support and/or the core area which is firmly connected to it, such that the plastic support is continuously subject to vibration during operation of the actuating apparatus. This frequently leads to the connection between the winding wires and the contact elements being torn off, which leads to the coil device and therefore the entire electromagnetic actuating apparatus losing its functionality, which in turn has negative effects on the functionality of the actuating partner, for example camshaft-travel switching of an engine, and therefore also to loss of the functionality of the engine itself.

The invention is therefore based on the object of developing an electromagnetic actuating apparatus of this generic type such that its life is increased.

SUMMARY OF THE INVENTION

This object is achieved by the electromagnetic actuating apparatus having an elongated actuating element which forms an engagement area at the end and can be moved by the force of a coil device, which is provided in a stationary manner, which actuating element has permanent magnet means in places, which are designed to interact with a stationary core area, wherein a stationary mounting element, which acts as a yoke, is provided axially opposite the core area for the actuating element, which is in the form of a piston at least in places, and wherein the coil device has at least one coil winding which is arranged on a support and whose winding wires are passed to contact elements and are electrically conductively connected to them, characterized in that the connections between the winding wires and the contact elements are arranged with vibration damping with respect to the support.

Advantageous developments of the invention will be made clear hereinbelow.

The invention is based on the idea of mounting the connection between at least one winding wire and the associated contact element, preferably between all of the winding wires and the associated contact elements, in a mechanically vibration-damped manner. The vibration-damped mounting of the connections between the winding wires and the contact elements with respect to the support for the coil winding or windings means that the vibration is not transmitted, or is transmitted at least in a damped form, however, to the electrically conductive connection between the winding wires and the contact elements, thus considerably reducing the mechanical load on said connections. This in turn means that this prevents or at least reduces the risk of the connection between the winding wires and the contact elements being torn off or destroyed, even during long-term use of the electromagnetic actuating apparatus.

One simple and effective option for vibration damping of the connection between the winding wires and the contact elements is to arrange the connections at least in places on or in an elastomer cushion, which is preferably held on the support for the coil winding. One suitable elastomer for vibration damping is silicone. This can be applied in a simple manner, preferably fully automatically during the course of manufacturing the electromagnetic actuating apparatus, to the contact elements and/or preferably to the support for the coil winding, in particular composed of plastic.

In order to provide vibration decoupling between the individual connections, it is advantageous for each connection to be mounted in a damped manner by a separate elastomer cushion. However, for manufacturing reasons, it may be advantageous to mount a plurality of connections, preferably all of the connections and in particular two connections, in or on an elastomer cushion, in particular composed of silicone.

In order to arrange the contact elements in a fixed position within the actuating apparatus in order to allow contact to be made with it, in particular from outside the actuating apparatus, it is advantageous for the contact elements to be in the form of contact pins which are held on the support. If the support is formed from plastic, one advantageous development of the invention provides that one end of each contact pin is extrusion-coated by the support or the support plastic. Once the plastic has cured, the contact pins are firmly seated on the support and are still electrically isolated from other components, because the support is formed from plastic.

In order to allow the electromagnetic actuating apparatus to be manufactured fully automatically, it is advantageous for the contact elements, in particular the contact pins, to be able to be moved, preferably bent, between a mounting position and a final position. In the mounting position, the free ends of the contact elements are preferably arranged at a distance from the support, such that the contact elements do not impede the fitting of one or more elastomer cushion or cushions to the support. The winding wires are preferably also electrically conductively fixed to the associated contact elements in the mounting position, as a result of which the contact elements with the winding wires fixed on them are bent around in the direction of the elastomer cushions and are thus mounted in a vibration-damped manner relative to the support for the coil device.

One expedient development of the invention advantageously provides for the winding wires to be passed through an aperture opening in the contact element. This makes it possible to pass the winding wires from the top face of the contact elements to the outer face in the final position, in order to solder or to weld them there. Instead of fixing the winding wires with the contact elements by soldering or welding, these connections can also be provided by adhesive bonding, in particular by application of an adhesive spot, in particular on the outside of the contact element. The winding wires are preferably passed fully automatically to the top face of the contact elements, and are fixed there, with the contact elements, in particular the contact pins, in the mounting position, before the contact elements are moved to the final position onto the elastomer cushions.

The contact elements, preferably the contact pins, advantageously have a holding section whose end is anchored within the support, and are additionally provided with a flat contact section at the end, which is suitable for fixing the winding wires and/or for making contact with an external electrical connection.

BRIEF DESCRIPTION OF THE DRAWINGS

Further advantages, features and details of the invention will become evident from the following description of preferred exemplary embodiments and with reference to the drawings, in which.

Identical components and components with the same function are identified by the same reference symbols in the Figures.

DETAILED DESCRIPTION

Figure 1:
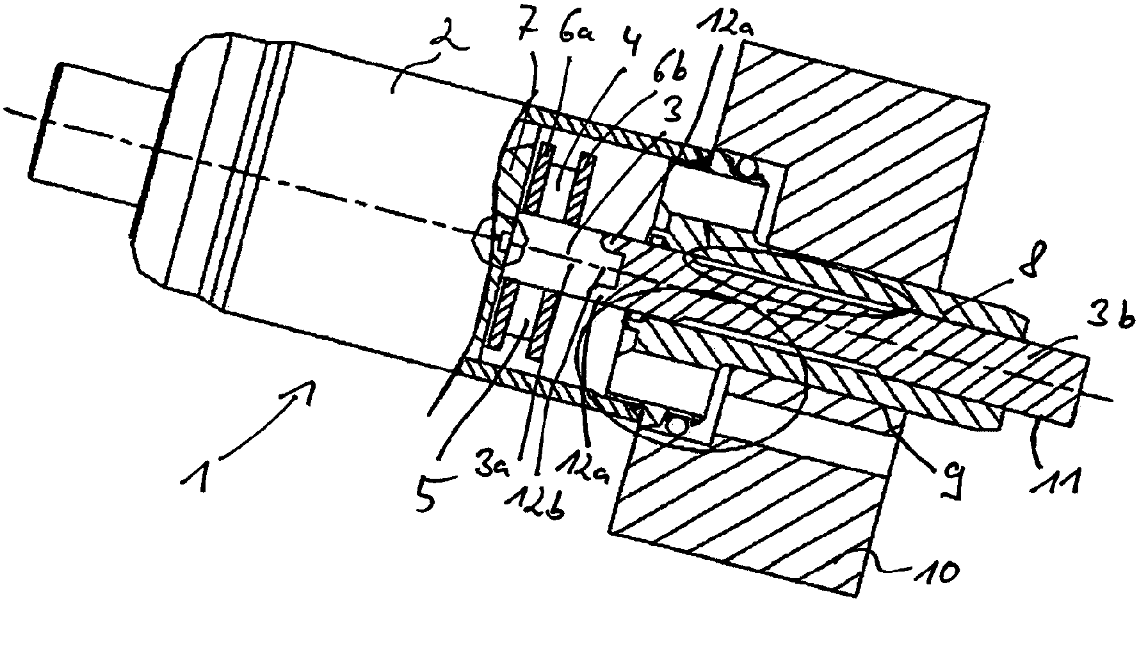
FIG. 1: shows a side, partially sectioned view of the electromagnetic actuating apparatus according to one preferred exemplary embodiment of the invention.

FIG. 1 shows an electromagnetic actuating apparatus 1 which interacts, for operating purposes, with an actuating partner that is not shown, in particular camshaft-travel switching. The electromagnetic actuating apparatus 1 comprises a hollow-cylindrical, magnetically permeable bush element 2, within which an elongated actuating element 3 in the form of a piston is arranged. The actuating element 3 passes through a permanent magnet arrangement 4, which arrangement is arranged on the element such that they cannot rotate with respect to one another and comprises a central, cylindrical soft-iron disk 5 as well as permanent magnets 6*a*, 6*b* which are arranged on both sides thereof and have a large diameter, but are less thick, however. The actuating element 3 is guided such that it can move between a stationary core area 7 and a mounting element 8 which is in the form of a sleeve and acts as a yoke, with the mounting element 8 being guided, forming a seal, in a correspondingly dimensioned hollow-cylindrical recess 9 in a support element 10, for example an engine block section.

The core area 7 is part of a coil device (13) (cf. FIGS. 2 to 5) which is not shown in FIG. 1, is arranged within the bush element 2 in the left-hand half of the drawing and acts on the actuating element 3, moving it, in particular away from the core area 7.

As can be seen from FIG. 1, the actuating element 3, which is in the form of a piston and is guided within the mounting element 8, is formed in two parts and comprises a first actuating element part 3*a*, which is arranged in the area of the permanent magnet arrangement 4, and an axially adjacent second actuating element part 3*b*, which is guided within the mounting element 8. At the end, the second actuating element part 3*b* has an engagement area 11 which acts in an actuating manner on the actuating partner, which is not illustrated. The two actuating element parts 3*a*, 3*b* are integrally connected to one another in an interlocking manner, such that they cannot rotate with respect to one another, and their end faces are laser-welded to one another. The interlocking connection is provided with connecting sections 12*a*, 12*b* which engage in one another axially and via which a torque can also be transmitted in the circumferential direction between the two actuating element parts 3*a*, 3*b*. The connecting sections 12*a*, 12*b* of the actuating element parts 3*a*, 3*b* are arranged alternately in the circumferential direction.

The first actuating element part 3*a*, which is on the left on the plane of the drawing, is formed from soft iron, and the second actuating element 3*b*, which is on the right on the plane of the drawing and comprises the engagement area 11, is formed from cold-formed austenite, and is thus mechanically stronger. In the present exemplary embodiment, the engagement area 11 overhangs the mounting element 8 even when the actuating element 3 is in the retracted state as shown.

The coil device 13, which is concealed by the bush element 2 in FIG. 1 and on which only one section of the mechanical core area 7 is shown in FIG. 1, is illustrated in detail in FIGS. 2 to 5. In this case, the upper (in FIGS. 2 to 5) end face 14 of the coil device 13 in FIG. 1 is arranged such that it points in the direction of the left-hand end of the magnetic actuating apparatus 1. The coil device 13 comprises a support 15 composed of plastic, which is essentially cylindrical. The metallic core area 7 is held in a central blind hole 16 within the support 15. At a radial distance from the core area 7, this is surrounded by a coil winding 17, wherein the coil winding 17 does not directly touch the core area 7 but is separated from it via a circumferential wall 18 of the support 15. The coil winding 17 is supported, downwards on the plane of the drawing, on a radial circumferential shoulder 19 on the support 15.

Two contact elements 20, 21, which are separated in the circumferential direction and are in the form of contact pins, are fixed on the support 15. These contact elements 20, 21 each comprise a thin holding section 20*a*, 21*a*, which is fixed on the support 15 in particular by extrusion coating, as well as in each case one flat contact section 20*b*, 21*b* at the end, which is used to make contact with an electrical power supply, which is not illustrated, in particular an appropriate plug element. A winding wire 22, 23 of the coil winding 17 is electrically conductively fixed, preferably firmly adhesively bonded, to each contact element 20, 21.

Figure 2:
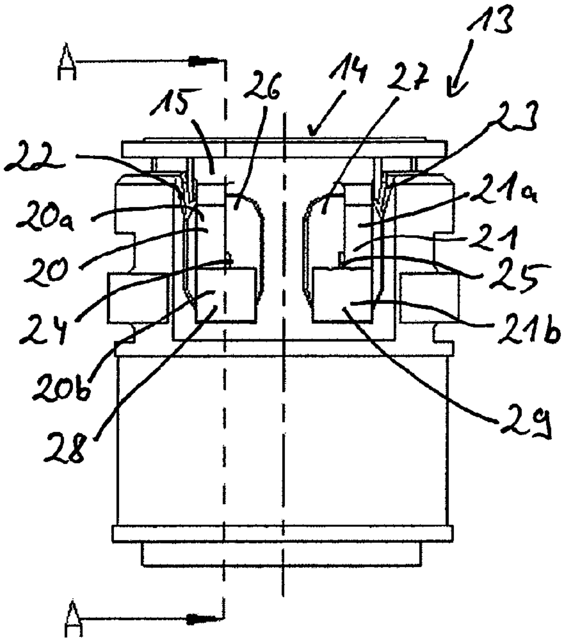
FIG. 2: shows a side view of the coil device, only part of which can be seen in FIG. 1.
Figure 4:
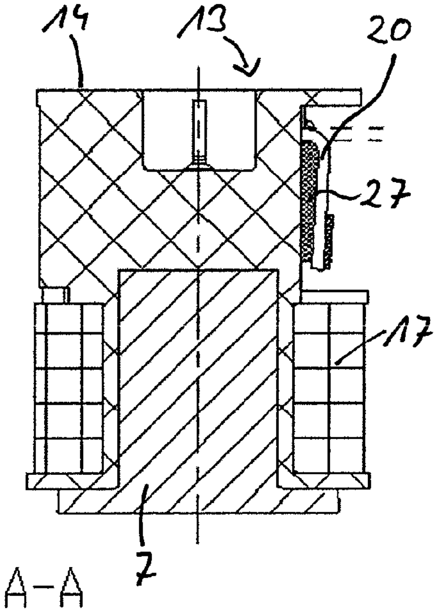
FIG. 4: shows a section view of the coil device along the section line A-A shown in FIG. 2, in the final position.
Figure 5:
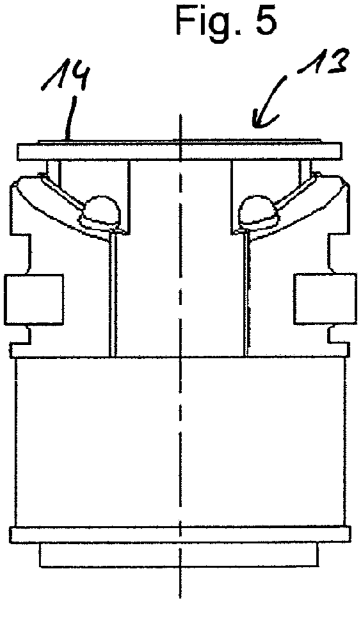
FIG. 5: shows a view of the coil device as shown in FIG. 2, rotated through 180°.

As can be seen in particular from FIGS. 2 and 4, the connections 24, 25 comprising winding wires 22, 23 and contact elements 20, 21 are mounted, in a vibration-damped manner, on the support 15 by means of a respective elastomer cushion 26, 27 composed of silicone. This advantageously prevents the connections 24, 25 from being shaken loose, that is to say the winding wires 22, 23 from becoming detached from the contact elements 20, 21 by knocking of the actuating element 3 and/or of the permanent magnet arrangement 4 on the core area 7 and/or the support 14.

Figure 3:
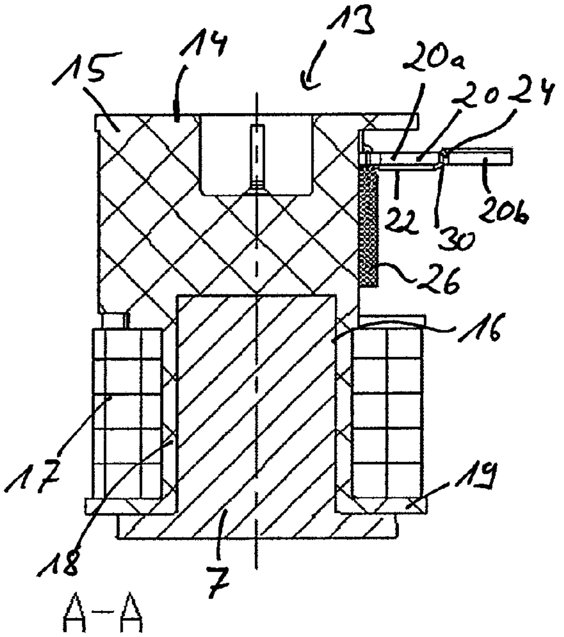
FIG. 3: shows a section view of the coil device along the section line A-A shown in FIG. 2, in the mounting position.

FIG. 3 shows the coil device 13 in a mounting position. In this position, the contact elements 20, 21, which are in the form of contact pins, project away from the support 15 in the radial direction. In this position, the elastomer cushions 26, 27 are fitted to the support 15, in particular by spraying on or adhesive bonding. Furthermore, in this position, the winding wires 22, 23 are fixed in particular by adhesive bonding on the upper faces 28, 29 of the contact elements 20, 21. For this purpose, the winding wires 22, 23 are preferably passed through an aperture opening 30 on the upper face 28, 29 and are fixed there, in particular by adhesive bonding.

After the fixing process and after the fitting of the elastomer cushions 26, 27, the contact elements 20, 21 are bent through about 90° (cf. FIG. 4) in such a way that they now point in the axial direction and rest on the elastomer cushions 26, 27, in a vibration-damped manner.

The invention claimed is:

1. An electromagnetic actuating apparatus comprising:

an elongated actuating element having an engagement area at an end thereof, a stationary coil device for moving the elongated actuating element, the elongated actuating element has permanent magnet means for interacting with a stationary core area, a stationary mounting element, which acts as a yoke, is provided axially opposite the stationary core area for the elongated actuating element, the elongated actuating device is in the form of a piston at least in places, and the stationary coil device has at least one coil winding which is arranged on a support and whose winding wires are passed to contact elements and are electrically conductively connected to them, wherein connections between the winding wires and the contact elements are arranged with an elastomer cushion for vibration damping with respect to the support, wherein the contact elements are bendable between a mounting position and a final position, and the contact elements with the winding wires in the final position, rest on the elastomer cushion.

2. The apparatus as claimed in claim 1, wherein each of the connections has an associated separate elastomer cushion.

3. The apparatus as claimed in claim 2, wherein the winding wires are soldered or welded to the contact elements.

4. The apparatus as claimed in claim 2, wherein the contact elements are bendable between a mounting position and a final position, and the contact elements with the winding wires in the final position, rest on the elastomer cushion.

5. The apparatus as claimed in claim 4, wherein in the mounting position, the contact elements extend away from the support in a radial direction and, in the final position, extend in an axial direction, parallel to the support.

6. The apparatus as claimed in claim 4, wherein at least one aperture opening is provided in the contact elements through which one of the winding wires is passed to an outer face in the final position of the contact element.

7. The apparatus as claimed in claim 1, wherein the contact elements are in the form of contact pins which are held on the support.

8. The apparatus as claimed in claim 7, wherein the support is formed from plastic, and one end of each contact element is extrusion-coated by the support.

9. The apparatus as claimed in claim 1, wherein the contact elements comprises a holding section and a flat contact section.

10. The apparatus as claimed in claim 1, wherein the actuating element is connected to means for camshaft-travel switching of an internal combustion engine.

* * * * *